(12) United States Patent
Kawaguchi

(10) Patent No.: US 10,634,703 B2
(45) Date of Patent: Apr. 28, 2020

(54) CURRENT SENSOR

(71) Applicant: YAZAKI CORPORATION, Tokyo (JP)

(72) Inventor: Yasunori Kawaguchi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 106 days.

(21) Appl. No.: 16/137,276

(22) Filed: Sep. 20, 2018

(65) Prior Publication Data

US 2019/0094272 A1 Mar. 28, 2019

(30) Foreign Application Priority Data

Sep. 25, 2017 (JP) ................................. 2017-183770

(51) Int. Cl.
*G01R 15/20* (2006.01)
*G01R 33/00* (2006.01)
*G01R 19/00* (2006.01)
*G01R 33/06* (2006.01)

(52) U.S. Cl.
CPC ......... *G01R 15/207* (2013.01); *G01R 15/202* (2013.01); *G01R 19/0092* (2013.01); *G01R 33/0076* (2013.01); *G01R 33/06* (2013.01)

(58) Field of Classification Search
CPC . G01R 15/207; G01R 15/202; G01R 33/0076
See application file for complete search history.

(56) References Cited

U.S. PATENT DOCUMENTS

| | | | | |
|---|---|---|---|---|
| 9,453,890 B2 * | 9/2016 | Yamashita | ............... | H01L 43/08 |
| 2011/0221430 A1 * | 9/2011 | Ito | ........................... | G01R 15/20 |
| | | | | 324/244 |
| 2014/0097826 A1 * | 4/2014 | Hebiguchi | ........... | G01R 15/207 |
| | | | | 324/117 R |
| 2015/0204915 A1 * | 7/2015 | Okuyama | .......... | G01R 19/0092 |
| | | | | 324/117 R |

FOREIGN PATENT DOCUMENTS

| | | |
|---|---|---|
| DE | 197 31 813 A1 | 1/1999 |
| EP | 1 037 056 A1 | 9/2000 |
| JP | 2000-258464 A | 9/2000 |
| JP | 2000-266785 A | 9/2000 |
| JP | 2002-243766 A | 8/2002 |
| JP | 5960403 B2 | 8/2016 |
| JP | 5993966 B2 | 9/2016 |

* cited by examiner

*Primary Examiner* — Dominic E Hawkins
(74) *Attorney, Agent, or Firm* — Kenealy Vaidya LLP

(57) ABSTRACT

A current sensor includes a main current path in which a main current flows, an auxiliary current path in which an auxiliary current flows, a magnetic detection element detecting intensity of a magnetic field in a magnetic detection direction and disposed around a detection target portion which is a part of the auxiliary current path, and a magnetic shield member disposed to surround the detection target portion and the magnetic detection element. The current sensor is configured to measure a magnitude of the auxiliary current flowing through the detection target portion based on the intensity of the magnetic field detected by the magnetic detection element. The auxiliary current path branches from the main current path and has a smaller cross-sectional area than that of the main current path.

7 Claims, 8 Drawing Sheets

FIG.4
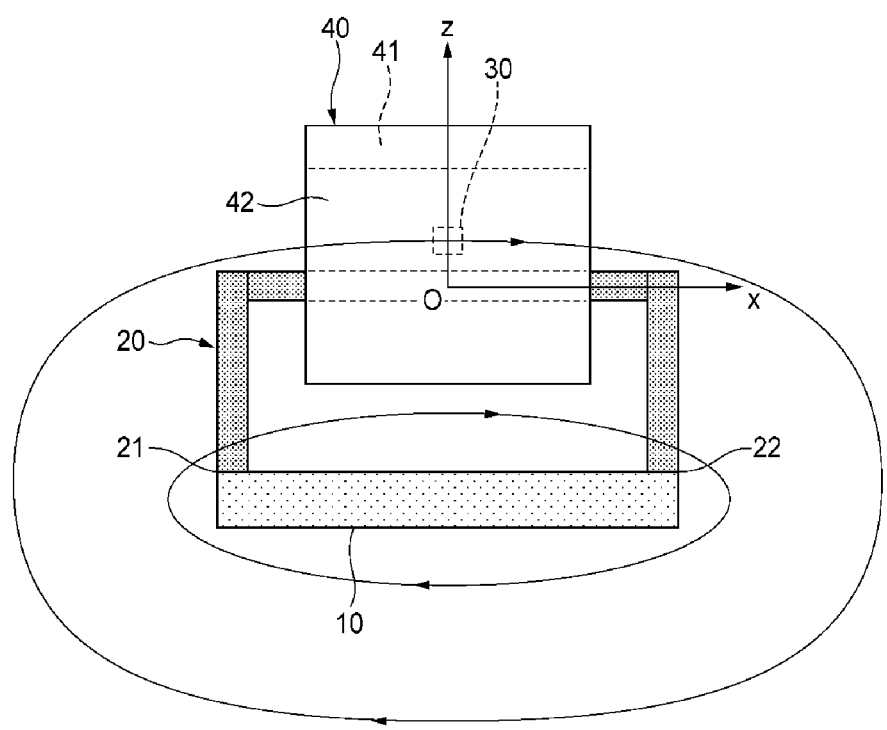
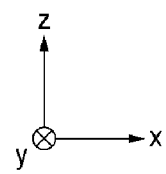

CURRENT SENSOR

CROSS REFERENCE TO RELATED APPLICATIONS

This application claims priority from Japanese Patent Application No. 2017-183770 filed on Sep. 25, 2017, the entire contents of which are incorporated herein by reference.

BACKGROUND OF THE INVENTION

Field of the Invention

The present invention relates to a current sensor.

Description of Related Art

From related art, there has been known a current sensor which includes a current path, a magnetic detection element disposed around the current path, and a magnetic shield member disposed so as to surround the current path and the magnetic detection element, and which measures the magnitude of a current flowing through the current path based on the intensity of the magnetic field detected by the magnetic detection element (for example, see Patent Literature 1: JP-B-5993966 and Patent Literature 2: JP-B-5960403).
[Patent Literature 1] JP-B-5993966
[Patent Literature 2] JP-B-5960403

In this type of current sensor, when measuring the magnitude of a large current flowing through a current path having a large cross-sectional area, the magnetic shield member surrounding the current path increases in size due to the large cross-sectional area of the current path. For this reason, there is a problem that the size of the current sensor as a whole increases and the manufacturing cost increases.

SUMMARY

One or more embodiments provide a current sensor which can prevent an increase in size and manufacturing cost even when measuring the magnitude of a large current flowing through a current path having a large cross-sectional area.

In an aspect (1), one or more embodiments provide a current sensor including a main current path in which a main current flows, an auxiliary current path in which an auxiliary current flows, a magnetic detection element detecting intensity of a magnetic field in a magnetic detection direction and disposed around a detection target portion which is a part of the auxiliary current path, and a magnetic shield member disposed to surround the detection target portion and the magnetic detection element. The current sensor is configured to measure a magnitude of the auxiliary current flowing through the detection target portion based on the intensity of the magnetic field detected by the magnetic detection element. The auxiliary current path branches from the main current path and has a smaller cross-sectional area than that of the main current path. A direction in which the main current path extends is set as a first direction, a direction orthogonal to the first direction and extending along a width direction of the main current path is set as a second direction, and a direction orthogonal to the first direction and the second direction and extending along a thickness direction of the main current path is set as a third direction. The detection target portion extends at least in the second direction. The magnetic detection element detects the intensity of the magnetic field only in the magnetic detection direction which is orthogonal to the second directions.

In an aspect (2), the detection target portion extends along the second direction.

In an aspect (3), the current sensor further including a plurality of magnetic detection elements. The plurality of magnetic detection elements are located, so that an external magnetic field different from a magnetic field derived from the main current included in each of the output values is canceled, when a sum or a difference of the output values of the plurality of magnetic detection elements is calculated.

In an aspect (4), the detection target portion includes a first portion extending along the second direction in which the auxiliary current flows toward a first side of the second direction, a second portion extending along the second direction in which the auxiliary current flows toward a second side of the second direction opposing to the first side of the second direction, and a third portion extending along the second direction in which the auxiliary current flows toward the first side of the second direction. Two of the plurality of magnetic detection elements are respectively disposed at locations corresponding to the first portion and the third portion, so that each of the magnetic detection directions is the first direction.

In an aspect (5), the detection target portion includes a first portion extending along the second direction in which the auxiliary current flows toward a first side of the second direction, a second portion extending along the second direction in which the auxiliary current flows toward a second side of the second direction opposing to the first side of the second direction, and a third portion extending along the second direction in which the auxiliary current flows toward the first side of the second direction. Two of the plurality of magnetic detection elements are respectively disposed at a first center position between the first portion and the second portion and at a second center position between the second portion and the third portion so that the magnetic detection direction of each of the plurality of magnetic detection elements is the third direction.

In an aspect (6), the main current path is a bus bar of a flat plate shape having a width dimension in the second direction and a thickness dimension in the third direction. The width dimension is larger than the thickness dimension.

In an aspect (7), the auxiliary current path is a lead frame formed on a circuit board, and one or more magnetic detection element and the magnetic shield member are fixedly disposed on the circuit board.

According to the aspect (1), the auxiliary current path surrounded by the magnetic shield member is a current path having a smaller cross-sectional area than the main current path and branching from the main current path. Therefore, the magnetic shield member can be miniaturized as compared with the aspect in which the magnetic shield member surrounds the main current path. In addition, in the auxiliary current path, an auxiliary current smaller than the main current flows by an amount corresponding to the ratio of the cross-sectional areas of the main current path and the auxiliary current path. Therefore, by measuring the magnitude of the auxiliary current flowing through the auxiliary current path based on the output value of the magnetic detection element, it is possible to calculate the magnitude of the main current flowing through the main current path, from the magnitude of the measured auxiliary current and the ratio of the cross-sectional area.

However, when measuring the auxiliary current flowing through the auxiliary current path as in the current sensor of the present configuration, there is a possibility that the magnetic field caused by the main current flowing through the main current path will affect the output value of the magnetic detection element as a disturbance. In this respect, in the current sensor of the present configuration, since the main current path extends in the first direction, the magnetic field due to the main current is generated in the direction along the circumferential direction of the main current path (that is, in the second direction). On the other hand, the magnetic detection direction of the magnetic detection element is set in a direction orthogonal to the second direction (along the circumferential direction of the detection target portion). Therefore, the magnetic field caused by the main current flowing through the main current path does not affect the output value of the magnetic detecting element as a disturbance.

Furthermore, in the current sensor of the present configuration, the detection target portion surrounded by the magnetic shield member in the auxiliary current path extends in a direction having at least a component in the second direction. Therefore, the magnetic field generated in the direction along the circumferential direction of the detection target portion due to the auxiliary current flowing through the detection target portion is a component in an arbitrary direction (that is, the magnetic detection direction) orthogonal to the second direction and extending along the circumferential direction of the detection target portion, and necessarily includes a component proportional to the magnitude of the auxiliary current. Therefore, by detecting the intensity of the magnetic field in the magnetic detection direction using the magnetic detection element, the magnitude of the auxiliary current can be measured.

As described above, according to the current sensor of the present configuration, it is possible to prevent the increase in size and manufacturing cost, and by measuring the magnitude of the auxiliary current flowing through the auxiliary current path with high accuracy, it is possible to provide a current sensor capable of accurately measuring the magnitude of the main current flowing through the main current path.

According to the aspect (2), since the detection target portion extends along the second direction, the magnitude of the component in the magnetic detection direction of the magnetic field caused by the auxiliary current flowing through the detection target portion is larger as compared with an aspect in which the detection target portion extends in a direction intersecting with the second direction (having at least a component in the second direction). Therefore, the output value of the magnetic detection element is increased, and the measurement accuracy of the magnitude of the auxiliary current is improved.

According to the aspect (3), the sum or difference value of the output values of the plurality of magnetic detection elements is not affected by the external magnetic field that can act as a disturbance separately from the magnetic field caused by the main current. In other words, the sum or difference value of the output values of the plurality of magnetic detection elements is not affected by both the magnetic field caused by the main current flowing through the main current path which can act as a disturbance, and the external magnetic field which can act as a disturbance. As a result, the magnitude of the auxiliary current flowing through the auxiliary current path (accordingly, the magnitude of the main current) can be measured with extremely high accuracy.

According to the aspect (4), by taking the sum of the output values of the two magnetic detection elements, the external magnetic field components included in the respective output values are certainly canceled out and the sum of the output values is twice the absolute value of each output value (see FIG. 5 to be described later). Therefore, it is possible to measure the magnitude of the auxiliary current flowing through the auxiliary current path (accordingly, the magnitude of the main current) with extremely high accuracy, based on the sum of the output values of the two magnetic detection elements.

In addition, the side of the auxiliary current flowing through the first and third portions of the detection target portion, and the side of the auxiliary current flowing through the second portion disposed between the first and third portions of the detection target portion are reversed. For this reason, the side of the magnetic field caused by the auxiliary current flowing through the first and third portions and the side of the magnetic field caused by the auxiliary current flowing through the second portion, which are received by the magnetic shield member, are also reversed. As a result, since the magnetic hysteresis generated in the magnetic shield member is reduced, it is also possible to prevent deterioration in measurement accuracy of the current sensor due to the presence of magnetic hysteresis.

According to the aspect (5), by taking the difference between the output values of the two magnetic detection elements, the external magnetic field components included in the respective output values are reliably canceled out and the difference in the output values is twice the absolute value of each output value (see FIG. 9 to be described later). Therefore, the magnitude of the auxiliary current flowing through the auxiliary current path (accordingly, the magnitude of the main current) can be measured with extremely high accuracy, based on the difference between the output values of the two magnetic detection elements. In addition, since the magnetic hysteresis occurring in the magnetic shield member is reduced similarly to the configuration of the above (4), deterioration in measurement accuracy of the current sensor due to the presence of magnetic hysteresis can also be prevented.

According to the aspect (6), the dimension in the third direction of the main current path can be made smaller than in the case where the sectional shape of the main current path is circular or the like. Therefore, by disposing the auxiliary current path (detection target portion) in the vicinity of one of the two main faces of the main current path, it is possible to further prevent the increase in size of the current sensor as a whole.

According to the aspect (7), it is possible to package all members constituting the current sensor excluding the main current path and including the circuit board. Therefore, the magnitude of the main current can be measured, by connecting the lead frame of the packaged current sensor to the main current path for which the magnitude of the main current is desired to be measured, and by measuring the magnitude of the auxiliary current flowing through the lead frame.

According to one or more embodiments, it is possible to provide a current sensor that can prevent an increase in size and manufacturing cost, even in the case of measuring the magnitude of a large current flowing through a current path having a large cross-sectional area.

One or more embodiments has been briefly described above. Furthermore, the details of the invention will be further clarified by reading the aspect for carrying out the invention described below with reference to the attached drawings.

BRIEF DESCRIPTION OF THE DRAWINGS

FIG. 4 is a side view of the current sensor illustrated in FIG. 1 as viewed from a y direction.

DETAILED DESCRIPTION

Hereinafter, a current sensor (hereinafter also referred to as "the present current sensor") according to an embodiment of the invention will be described with reference to the drawings.

(Configuration of Present Current Sensor)

Figure 1:
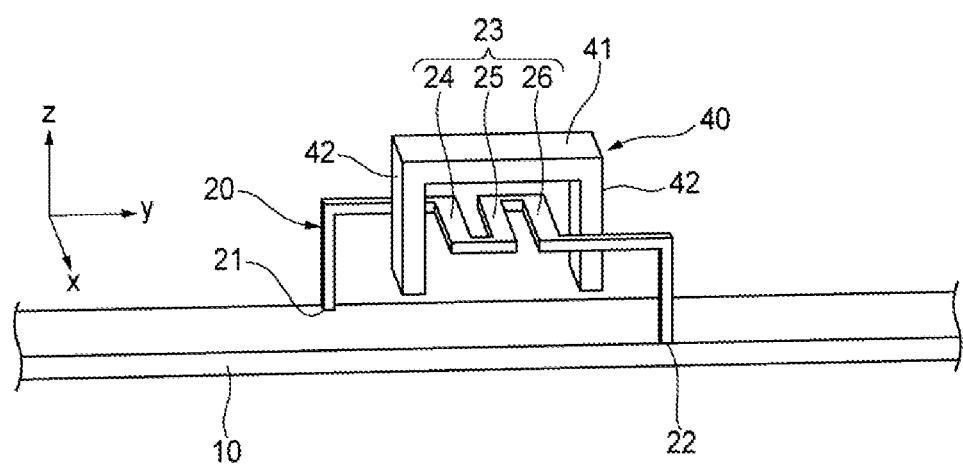
FIG. 1 is a perspective view schematically illustrating a current sensor according to an embodiment.

As illustrated in FIGS. 1 to 4, the current sensor includes a main current path 10, an auxiliary current path 20 branching from the main current path 10, a magnetic detection element 30 disposed around the auxiliary current path 20, and a magnetic shield member 40 disposed so as to surround the auxiliary current path 20 and the magnetic detection element 30. In FIG. 1, description of the magnetic detection element 30 is omitted. Actually, these members are disposed in a resin case (not illustrated) or the like, and are fixed to a resin case or the like so as to maintain a predetermined relative positional relation. The present current sensor is a current sensor that measures the magnitude of the main current flowing through the main current path 10 by measuring the magnitude of the auxiliary current flowing through the auxiliary current path 20.

Hereinafter, for convenience of explanation, an "x direction", a "y direction" and a "z direction" are defined as illustrated in FIG. 1 and the like. The x direction, the y direction, and the z direction are orthogonal to each other. In addition, a positive side of the z direction may be referred to as an "up", and a negative side of z direction may be referred to as a "down". The x direction, the y direction, and the z direction respectively correspond to a "second direction", a "first direction" and a "third direction" of the invention. Each member constituting the present current sensor will be described in order below.

The main current path 10 is a flat bus bar (metal plate) which linearly extends in the y direction and has a width dimension in the x direction larger than a thickness dimension in the z direction. In the main current path 10, as indicated by arrows in FIGS. 2 and 3, it is assumed that the main current flows in the positive side of the y direction.

The auxiliary current path 20 is a current path (bus bar) having a rectangular cross section branching off from the main current path 10. The auxiliary current path 20 is made of the same metallic material as the main current path 10. In this example, one end 21 of the auxiliary current path 20 is connected to a predetermined position on the negative side of the x direction side of the main current path 10, and the other end 22 is connected to a predetermined position on a downstream side of the main current path 10 (the positive side of the y direction side) in the positive side of the x direction. That is, the portion between the one end 21 and the other end 22 of the auxiliary current path 20 in the y direction of the main current path 10 and the auxiliary current path 20 constitute a parallel circuit.

The auxiliary current path 20 has a smaller cross-sectional area than the main current path 10. Therefore, in the auxiliary current path 20, an auxiliary current smaller than the main current by an amount corresponding to a ratio of the cross-sectional areas of the main current path 10 and the auxiliary current path 20 flows from the one end 21 toward the other end 22 as illustrated by arrows in FIGS. 2 and 3.

Figure 2:
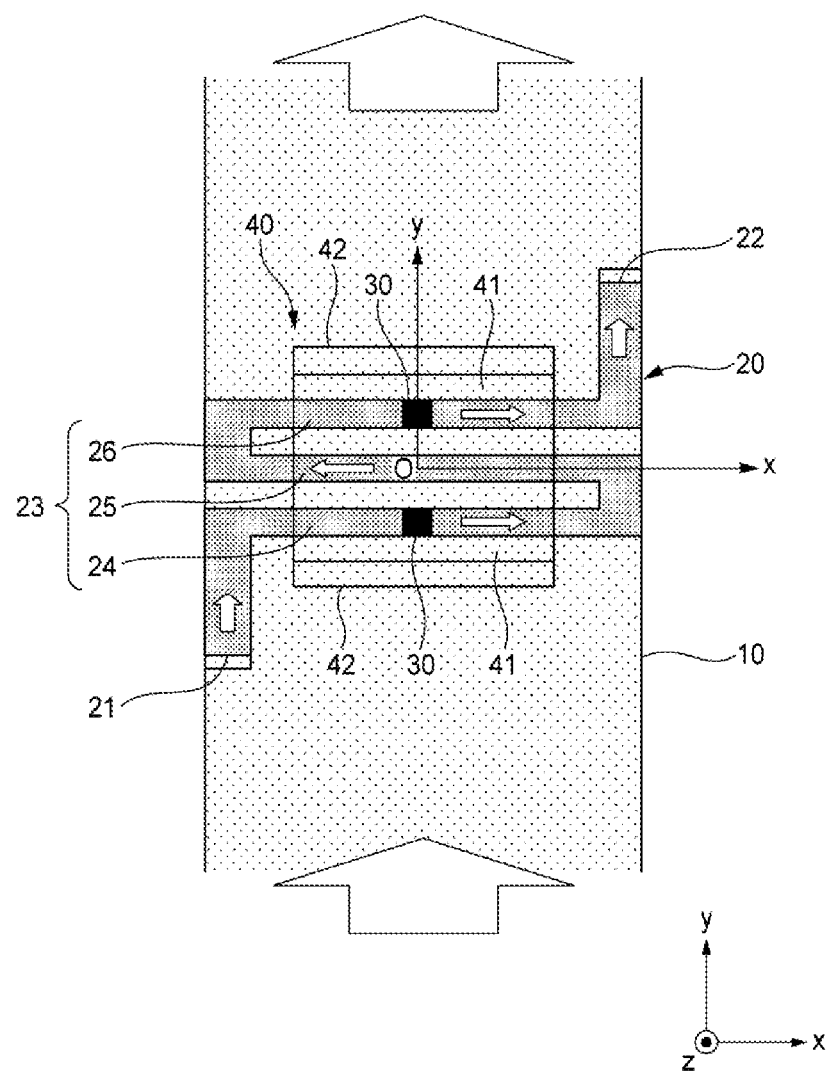
FIG. 2 is a plan view of the current sensor illustrated in FIG. 1 as viewed from a z direction.
Figure 3:
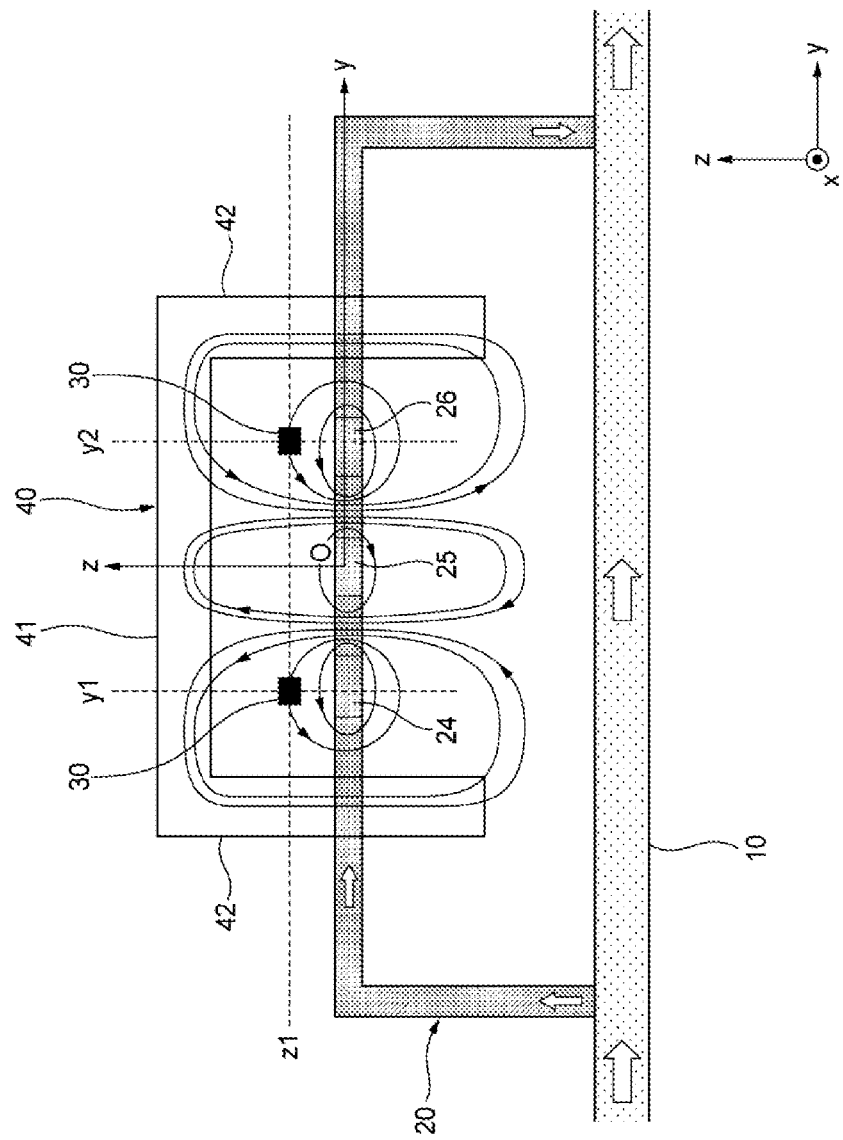
FIG. 3 is a side view of the current sensor illustrated in FIG. 1 as viewed from an x direction.

As illustrated in FIGS. 1 to 3, in the auxiliary current path 20, a portion (hereinafter referred to as a "detection target portion 23") extending in the y direction, while reciprocating a plurality of number of times in the x direction at a position (in the x-y plane) spaced by a predetermined distance upward from the main current path 10 is provided. Specifically, as illustrated in FIG. 2, the detection target portion 23 includes a first portion 24 which extends along the x direction to cause the auxiliary current to flow in a positive side in the x direction, a second portion 25 which is located on the positive side side in the y direction from the first portion 24 and extends in the x direction to cause the auxiliary current to flow in the negative side in the x direction, and a third portion 26 which is located on the positive side in the y direction from the second portion 25 and extends along the x direction to cause the auxiliary current to flow in a positive side in the x direction.

In this example, the magnetic detection element 30 is a Hall element for detecting the intensity of the magnetic field in only one direction (magnetic detection direction), and as illustrated in FIGS. 2 to 4, the magnetic detection elements 30 are respectively disposed at two positions separated upward by a predetermined distance from the detection target portion 23 of the auxiliary current path 20. The specific arrangement of the two magnetic detection elements 30 will be described later.

The magnetic shield member 40 is disposed to surround the detection target portion 23 of the auxiliary current path 20 and the two magnetic detection elements 30. Specifically, the magnetic shield member 40 has a flat plate-like upper wall portion 41 extending in the y direction so as to traverse the detection target portion 23 of the auxiliary current path 20 along the y direction, and a pair of flat plate-like side wall portions 42 projecting downward from both end portions in the y direction of the upper wall portion 41, and is formed in a substantially U shape. In this manner, the magnetic shield member 40 surrounds the auxiliary current path 20 having a smaller cross-sectional area than the main current path 10 and branching from the main current path 10. Therefore, the magnetic shield member 40 can be miniaturized as compared with the aspect in which the magnetic shield member 40 surrounds the main current path 10.

The magnetic shield member 40 is provided to prevent deterioration of measurement accuracy of the present current sensor caused by a magnetic field around the present current sensor. The magnetic shield member 40 is made of a soft magnetic material having a small residual magnetic flux density, such as, for example, permalloy or silicon copper. Since the magnetic shield member 40 is made of a soft magnetic material, it is possible to prevent the deterioration of the measurement accuracy of the present current sensor caused by the remanent magnetization of the magnetic shield member 40.

In the present current sensor, in reality, a circuit board (not illustrated) to which two magnetic detection elements 30 are fixed is provided. On this circuit board, a control device (not illustrated) for calculating the magnitude of the auxiliary current flowing through the detection target portion 23 (accordingly, the auxiliary current path 20) based on the output values of the two magnetic detection elements 30 is provided. The control device calculates the magnitude of the main current flowing through the main current path 10 from the magnitude of the auxiliary current thus calculated and the ratio of the cross-sectional area described above. The configuration of this current sensor has been described above.

(Arrangement of Two Magnetic Detection Elements)

Next, the arrangement of the two magnetic detection elements 30 disposed around the detection target portion 23 of the auxiliary current path 20 so as to be surrounded by the magnetic shield member 40 will be described with reference to FIGS. 2 to 6. For convenience of explanation, as illustrated in FIGS. 2 to 4, the x, y, z coordinate axes taking the center position in the x direction of the second portion 25 of the detection target portion 23 as the origin O is taken.

In the present current sensor, in order to accurately calculate the magnitude of the auxiliary current flowing through the detection target portion 23, the following three viewpoints are important.

<Point of View 1>

The side of the magnetic field caused by the auxiliary current flowing through the detection target portion 23 at the place where the magnetic detection element 30 is disposed is close (more preferably coincident) with the magnetic detection direction of the magnetic detection element 30.

<Point of View 2>

The output value of the magnetic detection element 30 is not affected by the "magnetic field caused by the main current flowing through the main current path 10" that can act as a disturbance.

<Point of View 3>

The output value of the magnetic detection element 30 shall not be affected by "an external magnetic field different from the magnetic field caused by the main current" (hereinafter simply referred to as "external magnetic field") which can act as a disturbance.

In order to satisfy all of the above three viewpoints, in the present example, as illustrated in FIGS. 2 to 4, the two magnetic detection elements 30 are disposed at the positions (y coordinates are y1 and y2) corresponding to the first portion 24 and the third portion 26 in the y direction (the x coordinate is 0, and the z coordinate is z1), respectively. In addition, the two magnetic detection elements 30 are disposed so that their magnetic detection directions coincide with the y direction. The reason why the above three viewpoints are satisfied by arranging the two magnetic detection elements 30 in this way will be described in order below.

<Point of View 1>

When the auxiliary current flows through the auxiliary current path 20, a magnetic field is generated as indicated by lines of magnetic force in FIG. 3. The lines of magnetic force illustrated in FIG. 3 indicate lines of magnetic force due only to the magnetic field caused by the auxiliary current. As can be understood from FIG. 3, at the location where the two magnetic detection elements 30 are disposed, the side of the magnetic field due to the auxiliary current coincides with the y direction. That is, the side of the magnetic field due to the auxiliary current is coincident with the magnetic detection direction of each of the two magnetic detection elements 30. As a result, the magnitude of the output value of the magnetic detection element 30 increases, and the magnitude of the auxiliary current can be accurately measured as compared with the case where the side of the magnetic field due to the auxiliary current intersects with the magnetic detection direction of the magnetic detection element 30.

<Point of View 2>

When the main current flows through the main current path 10, the magnetic field is generated as illustrated by lines of magnetic force in FIG. 4. The lines of magnetic force illustrated in FIG. 4 illustrate lines of magnetic force due only to the magnetic field caused by the main current. As can be understood from FIG. 4, the side of the magnetic field caused by the main current coincides with the x direction at the portion where the two magnetic detection elements 30 are disposed. That is, the side of the magnetic field due to the main current is orthogonal to the magnetic detection direction (=y direction) of each of the two magnetic detection elements 30. Therefore, the output values of each of the two magnetic detection elements 30 are not affected by the "magnetic field caused by the main current flowing through the main current path 10" which can act as a disturbance. As a result, it is possible to prevent deterioration of measurement accuracy of the magnitude of the auxiliary current due to the "magnetic field caused by the main current flowing through the main current path 10".

<Point of View 3>

Figure 5:
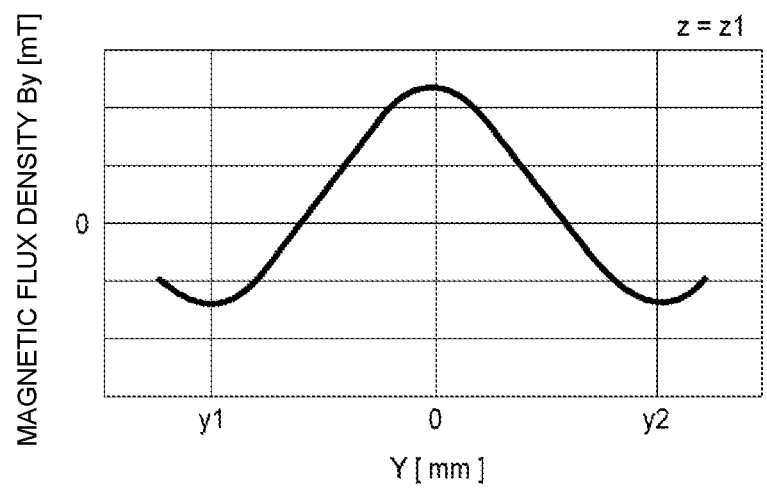
FIG. 5 is a graph illustrating an example of a transition with respect to a y coordinate of a magnetic flux density in the y direction due to a magnetic field caused by an auxiliary current at which a z coordinate is located at position of z=z1 illustrated in FIG. 3.

FIG. 5 illustrates an example of the transition with respect to the y coordinate of the magnetic flux density By in the y direction due to only the magnetic field caused by the auxiliary current when the auxiliary current flows in the auxiliary current path 20 (when the x coordinate is 0 and the z coordinate is z1). As can be understood from FIG. 5, at two places where the two magnetic detection elements 30 are disposed (y coordinates y1 and y2), an absolute value of the magnetic flux density By in the y direction becomes maximum and the polarity becomes match.

Figure 6:
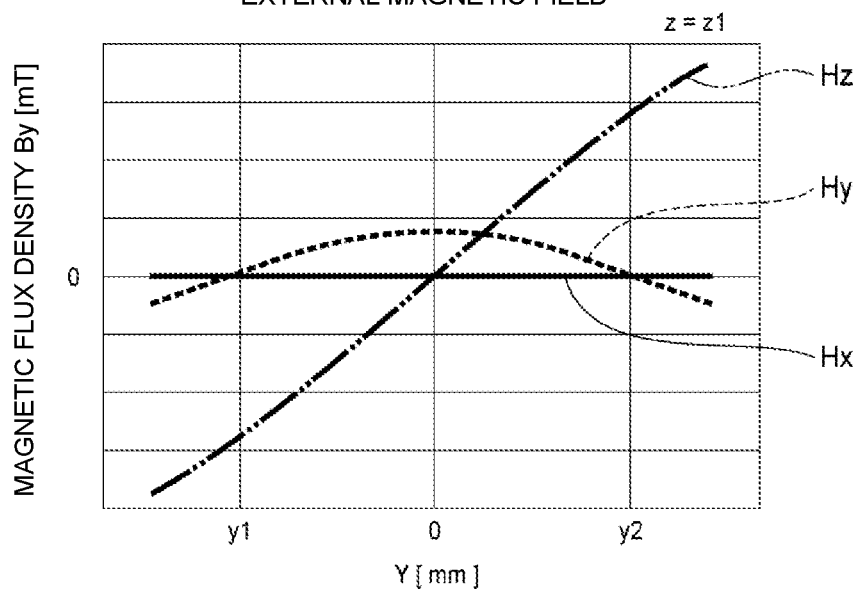
FIG. 6 is a graph illustrating an example of a transition with respect to a y coordinate of magnetic flux density in the y direction due to an external magnetic field at which a z coordinate is located at position of z=z1 illustrated in FIG. 3.

FIG. 6 illustrates an example of the transition with respect to the y coordinate of the magnetic flux density By in the y direction (in the case where the x coordinate is 0 and the z coordinate is z1) by the external magnetic field, a curve Hx illustrates the transition when only the external magnetic field in the x direction acts, a curve Hy illustrates the transition when only the external magnetic field in the y direction acts, and a curve Hz illustrates the transition in the case where only the external magnetic field in the z direction acts. As can be understood from FIG. 6, in two places (y coordinates are y1 and y2) where the two magnetic detection elements 30 are disposed, the magnetic flux density By in the y direction due to the external magnetic field in the x direction and the y direction is substantially zero. On the other hand, the magnetic flux density By in the y direction due to the external magnetic field in the z direction has a large value with different polarity and substantially the same absolute value.

As described above, the respective output values of the two magnetic detection elements 30 are influenced by the external magnetic field in the z direction. However, by taking the sum of the output values of the two magnetic detection elements 30, the external magnetic field components in the z direction contained in the respective output values are reliably canceled out, and the absolute value of the sum of the output values is twice the absolute value of each output value. In other words, the sum of the respective output values of the two magnetic detection elements 30 is not influenced by the external magnetic field which can act as a disturbance, and has a large absolute value. Therefore, in the present example, by calculating the magnitude of the auxiliary current flowing through the auxiliary current path 20 based on the sum of the output values of the two magnetic detection elements 30, it is possible to prevent the deterioration in measurement accuracy of the magnitude of the auxiliary current caused by the external magnetic field.

As described above, in the current sensor illustrated in FIGS. 2 to 4 (that is, the two magnetic detection elements 30 are disposed so that the respective magnetic detection directions coincide with the y direction at positions corresponding to the first portion 24 and the third portion 26 in the y direction), by calculating the magnitude of the auxiliary current flowing through the detection target portion 23 based on the sum of the output values of the two magnetic detection elements 30, the aforementioned three viewpoints are satisfied. As a result, it is possible to precisely calculate the magnitude of the auxiliary current flowing through the detection target portion 23 (accordingly, the magnitude of the main current flowing through the main current path 10).

As described above, according to the present current sensor, the auxiliary current path 20 surrounded by the magnetic shield member 40 is a current path having a smaller cross-sectional area than the main current path 10 and branching from the main current path 10. Therefore, the magnetic shield member 40 can be miniaturized as compared with the aspect in which the magnetic shield member 40 surrounds the main current path 10. In addition, in the auxiliary current path 20, an auxiliary current smaller than the main current flows by an amount corresponding to the ratio of the cross-sectional areas of the main current path and the auxiliary current path 20. Therefore, by measuring the magnitude of the auxiliary current flowing through the auxiliary current path 20 based on the output value of the magnetic detection element 30, it is possible to calculate the magnitude of the main current flowing through the main current path 10, from the magnitude of the measured auxiliary current and the ratio of the aforementioned cross-sectional area.

Further, in the present current sensor, the above-mentioned three viewpoints are satisfied by calculating the magnitude of the auxiliary current flowing through the detection target portion 23 based on the sum of the output values of the two magnetic detection elements 30. As a result, it is possible to precisely calculate the magnitude of the auxiliary current flowing through the detection target portion 23 (accordingly, the magnitude of the main current flowing through the main current path 10).

Further, in the present current sensor, as can be understood from FIG. 3, the side of the auxiliary current flowing through the first and third portions 24 and 26 of the detection target portion 23, and the side of the auxiliary current flowing through the second portion 25 disposed between the first and third portions 24 and 26 of the detection target portion 23 are opposite to each other. Therefore, the side of the magnetic field caused by the auxiliary current flowing through the first and third portions 24 and 26 and the side of the magnetic field caused by the auxiliary current flowing through the second portion received by the magnetic shield member 40 are also opposite to each other. As a result, since the magnetic hysteresis occurring in the magnetic shield member 40 is reduced, it is also possible to prevent deterioration in measurement accuracy of the current sensor due to the presence of magnetic hysteresis.

It should be noted that the present invention is not limited to each of the above embodiments, and various modified examples can be adopted within the scope of the invention. For example, the invention is not limited to the above-described embodiment, but may be appropriately modified, improved, and the like. In addition, materials, shapes, dimensions, numbers, placement locations, and the like of each of the constituent elements in the above-described embodiment are arbitrary as far as the invention can be achieved, and are not limited.

Figure 7:
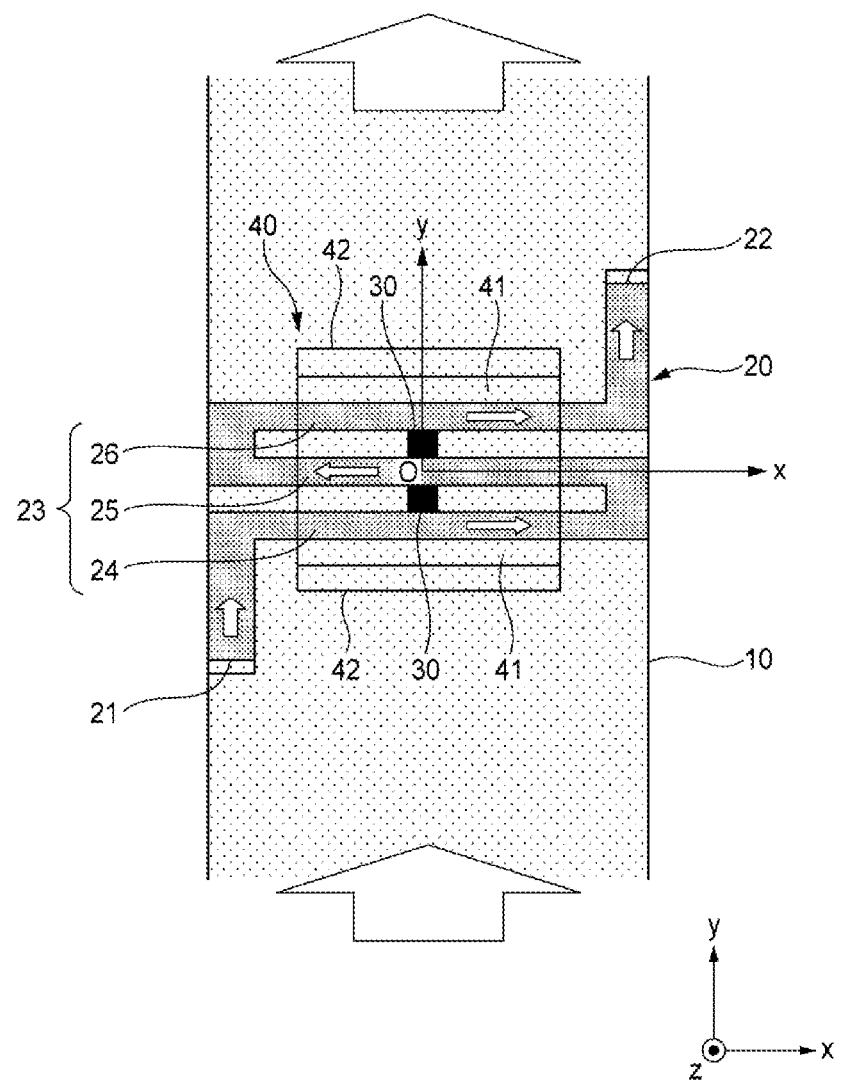
FIG. 7 is a plan view corresponding to FIG. 2 of a current sensor according to a modified example of the embodiment.
Figure 8:
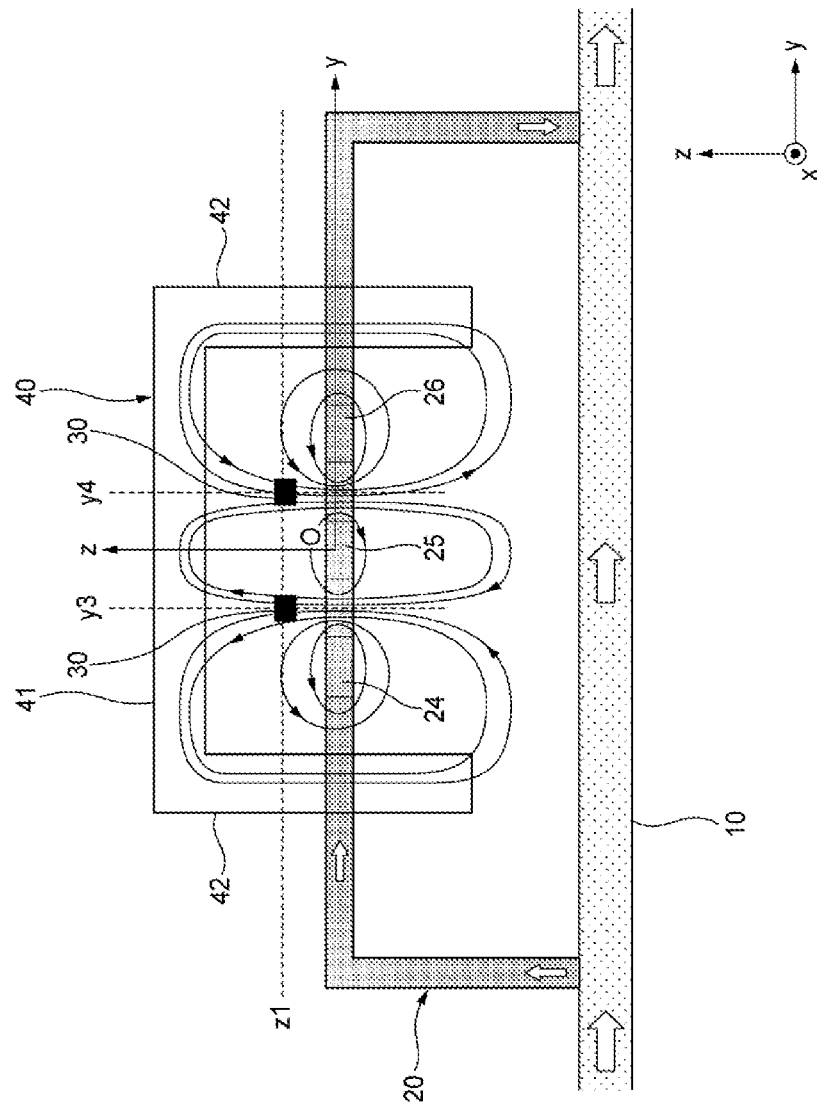
FIG. 8 is a side view corresponding to FIG. 3 for the current sensor illustrated in FIG. 7.

For example, in the above-described embodiment, as illustrated in FIGS. 2 to 4, the two magnetic detection elements 30 are disposed at positions (y coordinates y1 and y2) corresponding to the first portion 24 and the third portion 26 in the y direction, so that their respective magnetic detection directions coincide with the y direction. On the other hand, as illustrated in FIGS. 7 and 8, the two magnetic detection elements 30 can be disposed at the center position (y coordinate is y3) between the first portion 24 and the second portion 25 in the y direction, and the center position (y coordinate is y4) between the second portion 25 and the third portion 26 in the y direction such that the respective magnetic detection directions coincide with the z direction. Even with the embodiments illustrated in FIGS. 7 and 8, the above three viewpoints are satisfied. This point will be described below.

<Point of View 1>

When an auxiliary current flows through the auxiliary current path 20, a magnetic field is generated as indicated by lines of magnetic force in FIG. 8. The lines of magnetic force illustrated in FIG. 8 indicate lines of magnetic force due only to the magnetic field caused by the auxiliary current. As can be understood from FIG. 8, at the location where the two magnetic detection elements 30 are disposed, the side of the magnetic field due to the auxiliary current coincides with the z direction. That is, the side of the magnetic field due to the auxiliary current is coincident with the magnetic detection direction of each of the two magnetic detection elements 30. As a result, the magnitude of the output value of the magnetic detection element 30 increases as compared with the case where the side of the magnetic field due to the auxiliary current intersects with the magnetic detection direction of the magnetic detection element 30, and the magnitude of the auxiliary current can be accurately measured.

<Point of View 2>

When a main current flows through the main current path 10, a magnetic field is generated as illustrated by lines of magnetic force in FIG. 4. The lines of magnetic force illustrated in FIG. 4 illustrate lines of magnetic force due only to the magnetic field caused by the main current. As can be understood from FIG. 4, the side of the magnetic field caused by the main current coincides with the x direction at the location where the two magnetic detection elements 30 are disposed. That is, the side of the magnetic field caused by the main current is orthogonal to the magnetic detection direction (=z direction) of each of the two magnetic detection elements 30. Therefore, the output values of each of the two magnetic detection elements 30 are not affected by the "magnetic field caused by the main current flowing through the main current path 10" which can act as a disturbance. As a result, it is possible to prevent deterioration of measurement accuracy of the magnitude of the auxiliary current due to the "magnetic field caused by the main current flowing through the main current path 10".

<Point of View 3>

Figure 9:
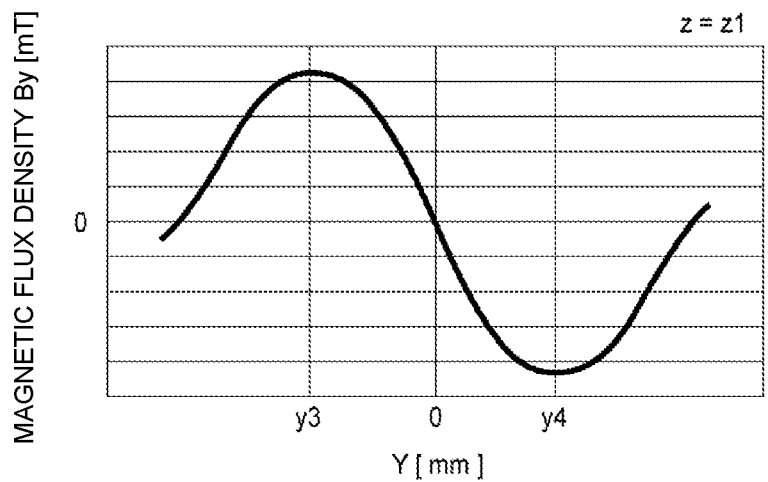
FIG. 9 is a graph illustrating an example of the transition with respect to the y coordinate of the magnetic flux density in the z direction due to the magnetic field caused by the auxiliary current at which the z coordinate is located at a position of z=z1 illustrated in FIG. 8 for the current sensor illustrated in FIG. 7.

FIG. 9 is a graph illustrating an example of transition with respect to y coordinate of magnetic flux density Bz in the z direction (in the case where the x coordinate is 0 and the z coordinate is z1) only due to the magnetic field caused by the auxiliary current when the auxiliary current flows in the auxiliary current path 20. As can be understood from FIG. 9, at two places where the two magnetic detection elements 30 are disposed (y coordinates y3 and y4), the absolute value of the magnetic flux density Bz in the z direction is maximum and the polarity is reversed.

Figure 10:
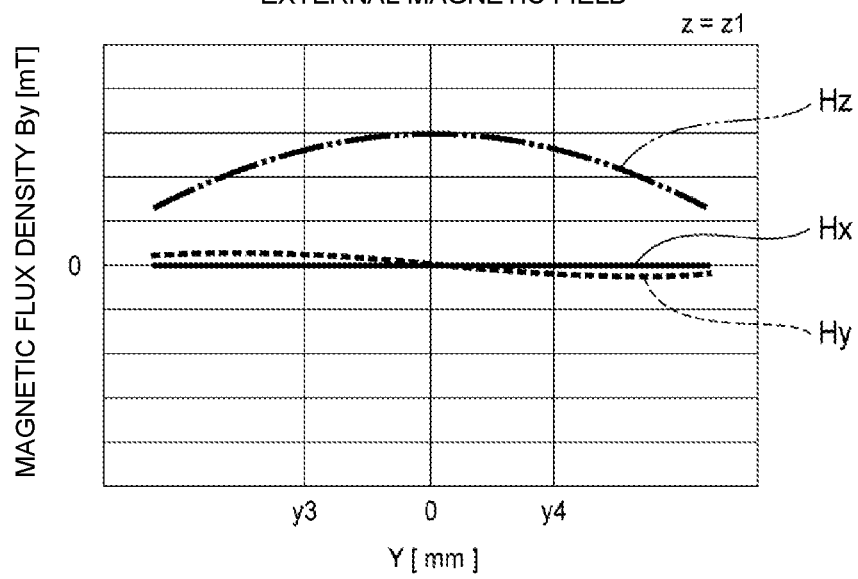
FIG. 10 is a graph illustrating an example of the transition with respect to the y coordinate of the magnetic flux density in the z direction due to the external magnetic field at which the z coordinate is located at the position of z=z1 illustrated in FIG. 8 for the current sensor illustrated in FIG. 7.

FIG. 10 illustrates an example of the transition with respect to the y coordinate of the magnetic flux density Bz in the z direction due to an external magnetic field (in the case where the x coordinate is 0 and the z coordinate is z1), a curve Hx illustrates an example of a case where only the external magnetic field in the x direction acts, a curve Hy illustrates the transition when only the external magnetic field in the y direction acts, and a curve Hz illustrates the transition in the case where only the external magnetic field in the z direction acts. As can be understood from FIG. 10, the magnetic flux density Bz in the z direction due to the external magnetic field in the x direction and the y direction is substantially zero at two places where the two magnetic detection elements 30 are disposed (y coordinates are y3 and y4). On the other hand, the magnetic flux density Bz in the z direction due to the external magnetic field in the z direction has a large value with the same polarity and substantially the same absolute value.

As described above, each of the output values of the two magnetic detection elements 30 are influenced by the external magnetic field in the z direction. However, by taking the difference between the output values of the two magnetic detection elements 30, the external magnetic field components in the z direction included in the respective output values are reliably canceled out, and the absolute value of the difference between the output values is twice the absolute value of each output value. In other words, the difference between the output values of the two magnetic detection elements 30 is not affected by the external magnetic field that can act as a disturbance, and the absolute value is a large value. For this reason, in the examples illustrated in FIGS. 7 and 8, by calculating the magnitude of the auxiliary current flowing in the auxiliary current path 20 based on the difference between the output values of the two magnetic detection elements 30, it is possible to prevent deterioration of the measurement accuracy of the magnitude of the auxiliary current caused by the external magnetic field.

As described above, in the examples illustrated in FIG. 7 and FIG. 8 (that is, the two magnetic detection elements 30 are disposed at the center position between the first portion 24 and the second portion 25 in the y direction and the center position in the y direction at the central position between the second portion 25 and the third portion so that the respective magnetic detection directions coincide with the z direction), the above three viewpoints are satisfied, by calculating the magnitude of the auxiliary current flowing through the section 23 based on the difference between the output values of the two magnetic detection elements 30. As a result, it is possible to precisely calculate the magnitude of the auxiliary current flowing through the detection target portion 23 (accordingly, the magnitude of the main current flowing through the main current path 10).

Furthermore, in the above embodiment, the detection target portion 23 (first to third portions 24 to 26) of the auxiliary current path 20 extends along the x direction. On the other hand, the detection target portion 23 (first to third portions 24 to 26) of the auxiliary current path 20 may extend in a direction intersecting with the x direction (having at least a component in the x direction).

Furthermore, in the above embodiment, the magnetic detection direction of the magnetic detection element 30 coincides with the y direction or the z direction, but the magnetic detection direction may be any arbitrary direction orthogonal to the x direction and along the circumferential direction of the detection target portion 23. As a result, the output value of the magnetic detection element 30 is not affected by the "magnetic field caused by the main current flowing through the main current path 10" which can act as a disturbance.

Furthermore, in the above-described embodiment, two magnetic detection elements 30 are disposed as magnetic detection elements, but three or more magnetic detection elements may be disposed to obtain the same operation and effect as the above embodiment. On the other hand, a single magnetic detection element 30 may be disposed. However, in this case, since the output value of the single magnetic detection element 30 is influenced by an external magnetic field which can act as a disturbance, the measurement accuracy of the magnitude of the auxiliary current is lowered.

Furthermore, the auxiliary current path 20 is a lead frame formed on the circuit board, and the magnetic detection element 30 and the magnetic shield member 40 may be fixedly disposed on the circuit board. In this case, all members constituting the current sensor excluding the main current path 10 can be packaged, using a resin case or the like including the circuit board. Therefore, it is possible to measure the magnitude of the main current, by connecting the lead frame of the packaged current sensor to the main current path for which the magnitude of the main current is desired to be measured and, by measuring the magnitude of the auxiliary current flowing through the lead frame.

Furthermore, in the above embodiment, the main current path 10 is formed of a bus bar (flat plate-like metal plate). On the other hand, the main current path 10 may be a thick electric wire having a circular cross section (whether it is a single wire or a double wire). Further, a location (branching and joining location) to which the end portion of the auxiliary current path 20 in the main current path 10 is connected may be an arbitrary position in the main current path 10.

Here, the characteristics of the current sensor according to the embodiment of the invention described above are briefly summarized and listed in the following (1) to (7), respectively.

(1) A current sensor comprising:

a main current path (10) in which a main current flows;

an auxiliary current path (20) in which an auxiliary current flows;

a magnetic detection element (30) detecting intensity of a magnetic field in a magnetic detection direction and disposed around a detection target portion (23) which is a part of the auxiliary current path (20); and a magnetic shield member (40) disposed to surround the detection target portion (23) and the magnetic detection element (30), wherein the current sensor is configured to measure a magnitude of the auxiliary current flowing through the detection target portion (23) based on the intensity of the magnetic field detected by the magnetic detection element (30), wherein the auxiliary current path (20) branches from the main current path (10) and has a smaller cross-sectional area than that of the main current path (10), wherein a direction in which the main current path (10) extends is set as a first direction, a direction orthogonal to the first direction and extending along a width direction of the main current path (10) is set as a second direction, and a direction orthogonal to the first direction and the second direction and extending along a thickness direction of the main current path (10) is set as a third direction, wherein the detection target portion (23) extends at least in the second direction, and wherein the magnetic detection element (30) detects the intensity of the magnetic field only in the magnetic detection direction which is orthogonal to the second direction.

(2) The current sensor described in the above (1), wherein the detection target portion (23) extends along the second direction.

(3) The current sensor described in the above (1) or (2), wherein the current sensor further comprises a plurality of magnetic detection elements (30), and wherein the plurality of magnetic detection elements (30) are located, so that an external magnetic field different from a magnetic field derived from the main current included in each of the output values is canceled, when a sum or a difference of the output values of the plurality of magnetic detection elements (30) is calculated.

(4) The current sensor described in the above (3), wherein the detection target portion (23) includes a first portion (24) extending along the second direction in which the auxiliary current flows toward a first side of the second direction, a second portion (25) extending along the second direction in which the auxiliary current flows toward a second side of the second direction opposing to the first side of the second direction, and a third portion (26) extending along the second direction in which the auxiliary current flows toward the first side of the second direction, and wherein two of the plurality of magnetic detection elements (30) are respectively disposed at locations corresponding to the first portion (24) and the third portion (26), so that each of the magnetic detection directions is the first direction.

(5) The current sensor described in the above (3), wherein the detection target portion (23) includes a first portion (24) extending along the second direction in which the auxiliary current flows toward a first side of the second direction, a second portion (25) extending along the second direction in which the auxiliary current flows toward a second side of the second direction opposing to the first side of the second direction, and a third portion (26) extending along the second direction in which the auxiliary current flows toward the first side of the second direction, and wherein two of the plurality of magnetic detection elements (30) are respectively disposed at a first center position between the first portion (24) and the second portion (25) and at a second center position between the second portion (25) and the third portion (26) so that the plurality of magnetic detection direction of each of the magnetic detection elements (30) is the third direction.

(6) The current sensor described in any one of the above (1) to (5), wherein the main current path (10) is a bus bar of a flat plate shape having a width dimension in the second direction and a thickness dimension in the third direction, and wherein the width dimension is larger than the thickness dimension.

(7) The current sensor described in any one of the above (1) to (6), wherein the auxiliary current path (20) is a lead frame formed on a circuit board, and one or more magnetic detection element (30) and the magnetic shield member (40) are fixedly disposed on the circuit board.

10: Main current path
20: Auxiliary current path
23: Detection target portion
24: First portion
25: second portion
26: Third portion
30: Magnetic detection element
40: Magnetic shield member

What is claimed is:

1. A current sensor comprising:
   a main current path in which a main current flows;
   an auxiliary current path in which an auxiliary current flows;
   a magnetic detection element detecting intensity of a magnetic field in a magnetic detection direction and disposed around a detection target portion which is a part of the auxiliary current path; and
   a magnetic shield member disposed to surround the detection target portion and the magnetic detection element,
   wherein the current sensor is configured to measure a magnitude of the auxiliary current flowing through the detection target portion based on the intensity of the magnetic field detected by the magnetic detection element,
   wherein the auxiliary current path branches from the main current path and has a smaller cross-sectional area than that of the main current path,
   wherein a direction in which the main current path extends is set as a first direction, a direction orthogonal to the first direction and extending along a width direction of the main current path is set as a second direction, and a direction orthogonal to the first direction and the second direction and extending along a thickness direction of the main current path is set as a third direction,
   wherein the detection target portion extends at least in the second direction, and
   wherein the magnetic detection element detects the intensity of the magnetic field only in the magnetic detection direction which is orthogonal to the second direction.

2. The current sensor according to claim 1,
   wherein the detection target portion extends along the second direction.

3. The current sensor according to claim 1,
   wherein the current sensor further comprises a plurality of magnetic detection elements, and
   wherein the plurality of magnetic detection elements are located, so that an external magnetic field different from a magnetic field derived from the main current included in each of the output values is canceled, when a sum or a difference of the output values of the plurality of magnetic detection elements is calculated.

4. The current sensor according to claim 3,
   wherein the detection target portion includes a first portion extending along the second direction in which the auxiliary current flows toward a first side of the second direction, a second portion extending along the second direction in which the auxiliary current flows toward a second side of the second direction opposing to the first side of the second direction, and a third portion extending along the second direction in which the auxiliary current flows toward the first side of the second direction, and wherein two of the plurality of magnetic detection elements are respectively disposed at locations corresponding to the first portion and the third portion, so that each of the magnetic detection directions is the first direction.

5. The current sensor according to claim 3,
wherein the detection target portion includes a first portion extending along the second direction in which the auxiliary current flows toward a first side of the second direction, a second portion extending along the second direction in which the auxiliary current flows toward a second side of the second direction opposing to the first side of the second direction, and a third portion extending along the second direction in which the auxiliary current flows toward the first side of the second direction, and wherein two of the plurality of magnetic detection elements are respectively disposed at a first center position between the first portion and the second portion and at a second center position between the second portion and the third portion so that the magnetic detection direction of each of the plurality of magnetic detection elements is the third direction.

6. The current sensor according to claim 1,
wherein the main current path is a bus bar of a flat plate shape having a width dimension in the second direction and a thickness dimension in the third direction, and
wherein the width dimension is larger than the thickness dimension.

7. The current sensor according to claim 1,
wherein the auxiliary current path is a lead frame formed on a circuit board, and the magnetic detection element and the magnetic shield member are fixedly disposed on the circuit board.

* * * * *